United States Patent [19]
Kim et al.

[11] Patent Number: 5,770,869
[45] Date of Patent: Jun. 23, 1998

[54] RESONANT TUNNELING HOT ELECTRON DEVICE

[75] Inventors: Gyung-Ock Kim; Dong-Wan Roh, both of Daejeon, Rep. of Korea

[73] Assignee: Electronics and Telecommunications Research Institute, Daejeon, Rep. of Korea

[21] Appl. No.: 717,905

[22] Filed: Sep. 23, 1996

[30] Foreign Application Priority Data

Dec. 21, 1995 [KR] Rep. of Korea .................. 95-53635

[51] Int. Cl.$^6$ ................ H01L 31/0328; H01L 31/0336; H01L 31/072; H01L 31/109
[52] U.S. Cl. ........................................ 257/197; 257/198
[58] Field of Search ................................ 257/197, 198

[56] References Cited

U.S. PATENT DOCUMENTS 5,031,013   7/1991   Choi .

FOREIGN PATENT DOCUMENTS

0440139A1   1/1991   European Pat. Off. .

OTHER PUBLICATIONS

Journal of Applied Physics, vol. 68, No. 6, 15 Sep. 1990, "Resonant interband coupling in single–barrier heterostructures of InAs/GaSb/InAs and GaSb/InAs/GaSb", Luo et al.

Applied Physics Letter 51, 28 Sep. 1987, "Room–temperature operation of hot–electron transistors", Levi et al.

Applied Physics Letter 69(14), 30 Sep. 1991, "Thermionic emission of and L electrons in the GaSb/InAs hot–electron transistors", Funato et al.

Kim et al, "Enhancement of Resonant Tunneling Current at Room Temperature", J. Appl. Phys. 81 (10), 15 May 1997, pp. 7070–7072.

Primary Examiner—Stephen Meier
Attorney, Agent, or Firm—Nixon & Vanderhye P.C.

[57] ABSTRACT

A resonant tunneling hot electron device uses an interband tunneling double barrier structure as an electron injection layer and is capable of increasing PVR and peak current using an enhanced resonant interband tunneling effect through alignment of a hole confined state and an electron confined state by a Stark shift effect. It includes a conductive collector layer formed on a substrate; a conductive base layer having a conduction band minimum lower than that of the emitter barrier layer and the collector barrier layer and having high electron mobility; a collector barrier layer formed between the base layer and the collector layer; and an electron injection electron barrier layer of an enhanced interband resonant tunneling quantum well broken band gap heterostructure formed between the emitter layer and the base layer. This structure exploits an enhanced resonant tunneling effect due to alignments of quantum confined states by Stark shifts.

5 Claims, 2 Drawing Sheets

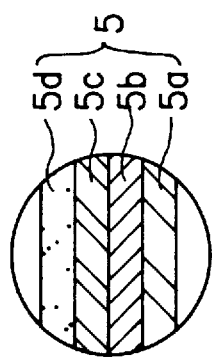
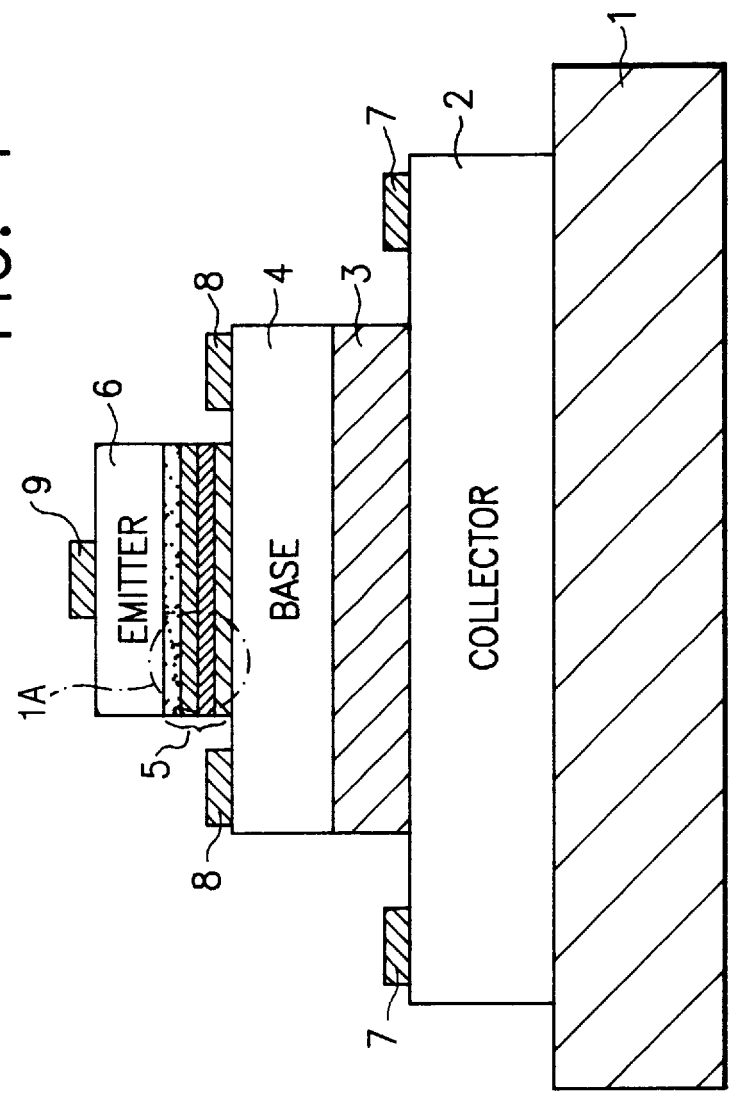

RESONANT TUNNELING HOT ELECTRON DEVICE

BACKGROUND OF THE INVENTION

1. Field of the Invention

The present invention relates to a resonant tunneling hot electron device, and particularly to an improved resonant tunneling hot electron device which is usable for a high speed logic and switching device and is capable of forming an interband tunneling double barrier broken-band gap hetrostructure at an emitter electron barrier of a heterojunction hot electron device and is capable of increasing peak-to-valley ratio and peak current using an enhanced resonant interband tunneling effect.

2. Description of the Conventional Art

Recently, as semiconductor growth techniques such as molecular beam epitaxy and metallic organic compound deposition are developed, semiconductor apparatus using a heterostructure has been widely studied.

Among the above-mentioned studies, a hot electron transistor (HET) which exploits a very rapid transfer time has been intensively studied. In this regard, there is a patent entitled "Hot electron transistor, EPO 440139 A1" and some articles: "Resonant interband coupling in single-barrier heterostructures of InAs/GaSb/InAs and GaSb/InAs/GaSb", Luo, L., et al., J. Appl. Phys., 68, 2854 (1990), U.S., "Room-temperature operation of hot electron transistor", Levi, A., et al., Appl. Phys. Lett, 51, 984 (1987), U.S., "Thermionic emission of r and L electrons in GaSb/InAs hot electron transistors", Funato, K, et al., Appl. Phys. Lett. 59, 1714 (1991), Japan. The above articles are directed to using the hot electron effect of a semiconductor double barrier broken band gap heterostructure. Namely, the above-mentioned methods fail to suggest an electron injection layer structure using enhanced resonant tunneling effect due to an alignment effect by a stark shift of a hole confined state and an electron confined state, that is, enhanced double resonant tunneling electron effect which is an inventive feature of the present invention. It has also been reported that in the tunneling heterostructures, the alignment of the Fermi level of an electrode with the lined-up quantum well states can greatly enhance the electronic resonant tunneling effect in "Enhancement of resonant tunneling current at room temperature", Kim et al; J. Appl. Phys. 81; 15 May 1997, pp. 7070–7072.

Meanwhile, if an InAs, which is a material having a high electron mobility as a base material, the electron transition time of the electron is significantly improved, thus enhancing performance of the device.

Among compositional materials for the above heterojunction apparatus, the combination of GaSb/InAs, InAs/ZnTe, and the like which have a nearly matched lattice feature generates a desired specific result.

Namely, the interband tunneling effect occurs, with a very short transfer time of electrons in the heterojunction structure in which a conduction band of one compositional material and a valence band of another compositional material are folded.

Therefore, in the industry, a technique, which uses an interband tunneling device which adapts a high electron mobility between the conduction band and the valence band of a broken energy bandgap heterostructure and an improved peak-to-valley current ratio of which its feature is improved by the conventional electron tunneling structure, is intensively studied.

SUMMARY OF THE INVENTION

Accordingly, it is an object of the present invention to provide an improved resonant tunneling hot electron device that overcomes problems encountered in the conventional resonant tunneling hot electron device.

It is another object of the present invention to provide an enhanced resonant tunneling hot electron device which uses interband tunneling double barrier broken band gap heterostructure as an emitter electron injection layer and is capable of increasing PVR and peak current using an enhanced double resonant interband tunneling electron effect through lined-up quantum confined hole and electron states by stark shift due to applied bias.

To achieve the above objects, there is provided a resonant tunneling hot electron device which includes a conductive collector layer formed on a substrate; a conductive base layer with a conduction band minimum that is lower than that of the emitter barrier layer and the collector barrier layer and having high electron mobility; a collector barrier layer formed between the base layer and the collector layer; and an emitter electron injecting barrier layer of an interband resonant tunneling quantum well structure formed between the emitter layer and the base layer.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 1 and 1a are cross-sectional views showing a resonant tunneling hot electron device according to the present invention.

DETAILED DESCRIPTION OF THE INVENTION

Figure 2A:
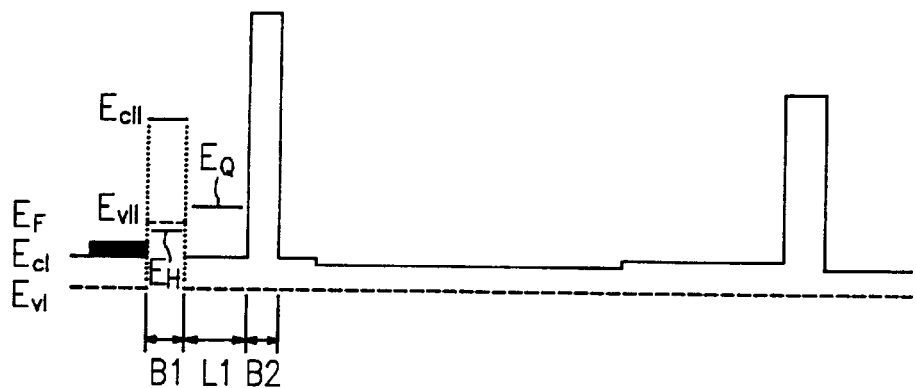
FIGS. 2A through 2C are views so as to show the lowest conduction band minimum and the valence band maximum at each layer under various voltages according to the present invention.
Figure 2B:
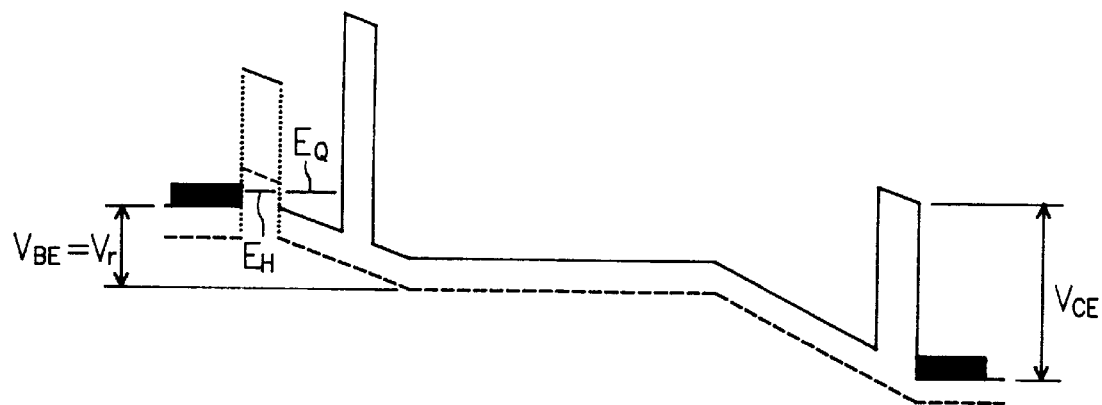
Figure 2C:
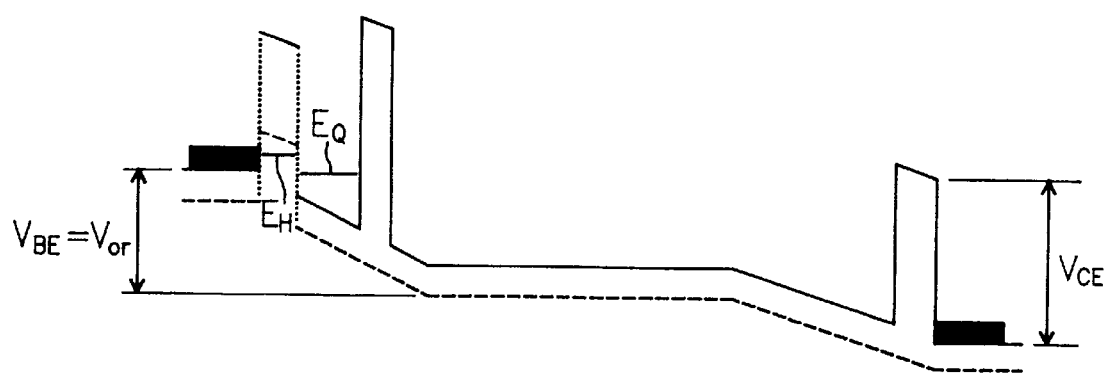

FIG. 1 is a cross-sectional view showing a resonant tunneling hot electron device, and FIGS. 2A through 2C show the schematic energy diagram for each constituent layer under various voltages according to the present invention.

As shown therein, the resonant tunneling hot electron device according to the present invention includes a conductive collector layer 2 formed on a substrate 1. An undoped collector barrier layer 3 is formed between a conductive base layer 4 and a conductive collector layer 2. A conductive base layer 4 conduction band minimum that is lower than that of the emitter barrier layer 5 and the collector barrier layer 3 has a high electron mobility. An emitter electron injecting barrier layer 5 of an interband tunneling broken band gap structure is formed between the conductive emitter layer 6 and the conductive base layer 4, and a conductive emitter layer 6 is formed thereon.

In the drawings, reference numeral 7 denotes a collector electrode, and reference numeral 8 denotes a base electrode, and reference numeral 9 denotes an emitter electrode.

In addition, as shown in FIG. 1a, the emitter electron injecting barrier layer 5 is formed of an undoped buffer(or spacer)layer 5a, a undoped emitter barrier layer 5b, a undoped electron quantum well layer 5c (namely, the barrier layer of the hole) which is made of the same material as the conductive emitter layer 6, and an undoped quantum well layer 5d of a hole (namely, the barrier layer of the electron) in which the conduction band of the quantum well layer 5c and the valence band of the emitter barrier layer 5b are folded.

The barrier layer of conductive emitter layer 6 has a structure which is combined with the interband resonant tunneling quantum well broken band gap heterostructure, namely, the hole quantum well layer 5b and 5d of the hole, and the electron quantum well layer 5c.

Here, the electron quantum well layer 5c acts as a barrier layer with respect to the hole quantum well structure 5d, and the hole quantum well structure 5d acts as the barrier layer with respect to the electron quantum well layer 5c formed therebelow.

As a result, a confined electron state is formed in the quantum well layer 5c and a confined hole state is formed in quantum well layer 5d.

Namely, in the combination structure in which two materials are capable of acting as a quantum well and barrier with respect to both electron and holes, the quantum well hole confined state when an external electric field is applied thereto is constructed in a way that alignment between the electron confined state and the hole confined state occurs, and emission of hot electrons occurs at the conductive base layer through this lined-up state.

In particular, the electron quantum well confined state $E_Q$ within the quantum well layer 5c is higher than the hole confined state $E_H$ of the quantum well layer 5d.

These quantum well confined states, as shown in FIGS. 2A through 2C, can be controlled in accordance with the width of each layer. Namely, it is controlled by the width L1 of electron quantum well layer 5c, the width B1 of hole quantum well layer 5d, and the width B2 of emitter barrier layer 5b.

The resonant tunneling by alignment of the Fermi energy state $E_F$ of the emitter layer and the aligned quantum well hole-electron confined states determines injection energy. The undoped buffer(or spacer)layer 5a formed between the emitter barrier layer 5b and the conductive base layer 4 can be used for adjustment of the injection energy by adjusting its width. In addition, the position of the buffer layer 5a may be formed in front of or after the interband tunneling double barrier structures 5c and 5d.

The alignment of the hole confined state and the electron confined state by the stark shift under the external bias is determined in accordance with the width combination of each of the quantum well layers, and the width of the buffer layer.

FIGS. 2A and 2C are views so as to show the conduction band minimum and the valence band maximum at each layer under the applied voltage according to the present invention.

In the drawings, reference character $E_F$ denotes a Ferrmi level of electrode, reference character $V_{CE}$ denotes a voltage between the emitter and the collector, reference character $V_{BE}$ denotes a voltage between the emitter and the base, reference character $E_{C1}$ denotes the emitter material conduction band minimum, reference character $E_{V1}$ denotes the band maximum, reference character $E_{C11}$ denotes the conduction band minimum value of the hole quantum well layer material, reference character $E_{V11}$ denotes the valence band maximum of the hole quantum well layer material, reference character $V_R$ denotes a resonant tunneling voltage of peak current, reference character $V_{OR}$ denotes an OFF-resonant tunneling voltage of valley current, reference character $E_Q$ denotes a quantum well confined energy state within the electron quantum well, reference character $E_H$ denotes a quantum well confined energy state within the hole quantum well, reference character B1 denotes the width of the hole quantum well structure, reference character L1 denotes the width of the electron quantum well layer of the electron, and reference character B2 denotes the width of the emitter barrier layer.

FIG. 2A shows the energy band diagram of the hot electron device in a state of the thermal eqilibrium.

As an example of the above operation, when the voltage $V_{BE}$ between the base and the emitter is the resonant tunneling voltage $V_r$, the alignment of the Fermi level of electrodes, the quantum well hole confined energy state and the quantum well electron confined energy state occur, and enhanced double resonant tunneling through these lined up states is generated, so that peak current is increased.

FIG. 2C is a view showing the energy band of the operational state of the hot electron device when the voltage $V_{B@}$ between the base and the emitter is an OFF resonant tunneling voltage $V_{OR}$.

In addition, if the interband resonant tunneling structure has more than three barriers instead of using the double barrier resonant tunneling structure, it is possible to obtain multi-current peaks in cooperation with at least two resonant tunneling quantum well electron confined states.

As described above, the resonant tunneling electron device according to the present invention is directed to an apparatus which is capable of inducing improved PVR due to a peak current increase resulting from the alignment effects of the hole quantum well confined state and the electron quantum well confined state, and is available for an advanced high speed switch, a high frequency switch, a high frequency oscillator, a high speed logic device with a new feature, and the like.

In particular, in the present invention, it is possible to overcome problems such as a lower current gain, lower PVR of a lower collector current, and the like. Moreover, it is possible to obtain various kinds of tailoring by concurrently using the confined states of the hole and electron in accordance with variation of the quantum well states and variation of the number of quantum wells based upon variation of the width and selection of the heterojunction material.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A resonant tunneling hot electron device comprising:
   a conductive emitter layer;
   a conductive collector layer formed on a substrate;
   a conductive base layer having a conduction band minimum which is lower than that of an emitter barrier layer and a collector barrier layer and having a higher electron mobility;
   a collector barrier layer formed between the base layer and the collector layer; and
   an emitter electron injecting barrier layer of an enhanced interband resonant tunneling quantum well broken band gap heterostructure formed between the emitter layer and the base layer which exploits the enhanced resonant tunneling effect due to the alignment of quantum confined states by Stark shift.

2. The device of claim 1, wherein said emitter electron injecting barrier layer includes:

an undoped buffer (or spacer) layer;

an undoped emitter barrier layer formed thereon;

an undoped electron quantum well layer, which is made of the same material as the emitter layer and which has an electron quantum well confined state higher than the hole quantum well confined state; and an undoped hole quantum well layer having a valence band folded with a conduction band of the adjacent undoped electron quantum well layer;

whereby there is an alignment between the hole quantum well confined state and the electron quantum well confined state when a voltage is externally supplied thereto, so that injection of hot electrons occurs through these aligned states to a base region.

3. The device of claim 2, wherein said electron quantum well layer acts as a barrier layer with respect to the hole quantum well layer.

4. The device of claim 2, wherein said hole quantum well layer acts as a barrier layer with respect to the electron quantum well layer.

5. The device of claim 1, wherein said emitter electron injection barrier layer is an enhanced interband resonant tunneling broken band gap heterostructure having more than three quantum barriers.

\* \* \* \* \*